United States Patent
Shida et al.

(10) Patent No.: US 7,992,516 B2
(45) Date of Patent: Aug. 9, 2011

(54) APPARATUS FOR FORMING PHOSPHOR LAYER AND METHOD FOR FORMING PHOSPHOR LAYER USING THE APPARATUS

(75) Inventors: Satoshi Shida, Osaka (JP); Hiroyuki Naito, Osaka (JP); Noriyasu Tanimoto, Osaka (JP); Yasuharu Ueno, Osaka (JP); Makoto Morikawa, Nara (JP)

(73) Assignee: Panasonic Corporation, Osaka (JP)

( * ) Notice: Subject to any disclaimer, the term of this patent is extended or adjusted under 35 U.S.C. 154(b) by 1078 days.

(21) Appl. No.: 11/722,854

(22) PCT Filed: May 11, 2006

(86) PCT No.: PCT/JP2006/309876
§ 371 (c)(1),
(2), (4) Date: Jun. 26, 2007

(87) PCT Pub. No.: WO2006/121197
PCT Pub. Date: Nov. 16, 2006

(65) Prior Publication Data
US 2010/0129525 A1    May 27, 2010

(30) Foreign Application Priority Data
May 12, 2005 (JP) .................................. 2005-139915

(51) Int. Cl.
*B05C 5/02* (2006.01)
(52) U.S. Cl. ........ 118/679; 118/680; 118/681; 118/712; 118/300; 118/323

(58) Field of Classification Search ................. 118/300, 118/323, 679–681, 712
See application file for complete search history.

(56) References Cited

U.S. PATENT DOCUMENTS

| 6,511,545 B2 * | 1/2003 | Banno et al. .................. 118/688 |
| 6,604,971 B1 | 8/2003 | Sun et al. |
| 2002/0096577 A1 | 7/2002 | Takeuchi et al. |
| 2004/0129921 A1 | 7/2004 | Endo et al. |

FOREIGN PATENT DOCUMENTS

| JP | 2001-15817 | 1/2001 |
| JP | 2004-216210 | 8/2004 |
| JP | 2005-028223 | 2/2005 |

* cited by examiner

*Primary Examiner* — Laura Edwards
(74) *Attorney, Agent, or Firm* — Hamre, Schumann, Mueller & Larson, P.C.

(57) ABSTRACT

A phosphor layer forming apparatus (1) in which a paste (21) containing a phosphor is discharged so as to cover each of a plurality of light-emitting elements (11) mounted on a substrate (10) includes the following: a discharge portion (12) for discharging the paste (21) in the form of droplets onto each of the light-emitting elements (11); a measurement portion (13) for measuring the thickness of individual phosphor layers that are formed of the paste (21) covering each of the light-emitting elements (11); and a discharge control portion (14) for controlling the amount of the paste (21) to be redischarged for each phosphor layer in accordance with the thickness of the individual phosphor layers measured by the measurement portion (13). This phosphor layer forming apparatus can reduce the manufacturing time.

4 Claims, 5 Drawing Sheets

APPARATUS FOR FORMING PHOSPHOR LAYER AND METHOD FOR FORMING PHOSPHOR LAYER USING THE APPARATUS

TECHNICAL FIELD

The present invention relates to an apparatus for forming a phosphor layer (also referred to as a "phosphor layer forming apparatus" in the following) that discharges a paste containing a phosphor and a method for forming a phosphor layer (also referred to as a "phosphor layer forming method" in the following) that uses the apparatus. In particular, the present invention relates to a phosphor layer forming apparatus that discharges the paste so as to cover each of a plurality of light-emitting elements mounted on a substrate and a phosphor layer forming method using the apparatus.

BACKGROUND ART

A light-emitting diode (referred to as "LED" in the following) is known as a light-emitting element including a semiconductor multilayer film. In particular, when a LED for emitting blue light such as a GaN LED is combined with a phosphor that emits yellow light or red light by excitation of the blue light, it can be applied to a light-emitting device for emitting white light (e.g., JP 2001-15817 A).

FIGS. 4A to 4D and 5A to 5C are cross-sectional views showing conventional manufacturing processes for the light-emitting device. As shown in FIG. 4A, a plurality of LED chips 102 are mounted on a substrate 101, and the top surfaces of the LED chips 102 are ground with a rotary grinder 103 to make the LED chips 102 even. Next, as shown in FIG. 4B, a paste containing a phosphor is applied to each of the LED chips 102, e.g., by screen printing, and phosphor layers 104 are formed. As shown in FIG. 4C, the top surfaces of the phosphor layers 104 are ground with the rotary grinder 103. Thus, as shown in FIG. 4D, the phosphor layers 104 are made even. Subsequently, the LED chips 102 covered with the phosphor layers 104 are separated from one another. Then, as shown in FIG. 5A, each LED chip 102 is mounted on a mounting board 106. As shown in FIG. 5B, the phosphor layer 104 is sealed with a sealing resin 107. Thereafter, as shown in FIG. 5C, a lens 108 is formed on the sealing resin 107, thereby providing a light-emitting device 100.

In the above manufacturing method, however, the grinding processes of FIGS. 4A and 4C take a long time, and thus it is difficult to reduce the manufacturing time For example, in the process of grinding the phosphor layers 104 in FIG. 4C, the height of each of the phosphor layers 104 should be controlled to the order of several μm to suppress variations in the chromaticity of light emitted from the light-emitting device 100 (see FIG. 5C). Therefore, the grinding process of FIG. 4C generally requires about an hour. This may result in lower productivity of the light-emitting device 100.

DISCLOSURE OF INVENTION

With the foregoing in mind, the present invention provides a phosphor layer forming apparatus that can reduce the manufacturing time and a phosphor layer forming method using the apparatus.

A phosphor layer forming apparatus of the present invention is an apparatus for forming a phosphor layer in which a paste containing a phosphor is discharged so as to cover each of a plurality of light-emitting elements mounted on a substrate. The apparatus includes the following: a discharge portion for discharging the paste in the form of droplets onto each of the light-emitting elements; a measurement portion for measuring the thickness of individual phosphor layers that are formed of the paste covering each of the light-emitting elements; and a discharge control portion for controlling the amount of the paste to be redischarged for each phosphor layer in accordance with the thickness of the individual phosphor layers measured by the measurement portion.

A phosphor layer forming method of the present invention is a method for forming a phosphor layer in which a paste containing a phosphor is discharged so as to cover each of a plurality of light-emitting elements mounted on a substrate. The method includes the following: discharging the paste in the form of droplets onto each of the light-emitting elements; measuring the thickness of individual phosphor layers that are formed of the paste covering each of the light-emitting element; and redischarging the paste onto the phosphor layers in accordance with the thickness of the individual phosphor layers measured in the measuring process while controlling the amount of the paste to be redischarged for each phosphor layer.

DESCRIPTION OF THE INVENTION

Figure 1A:
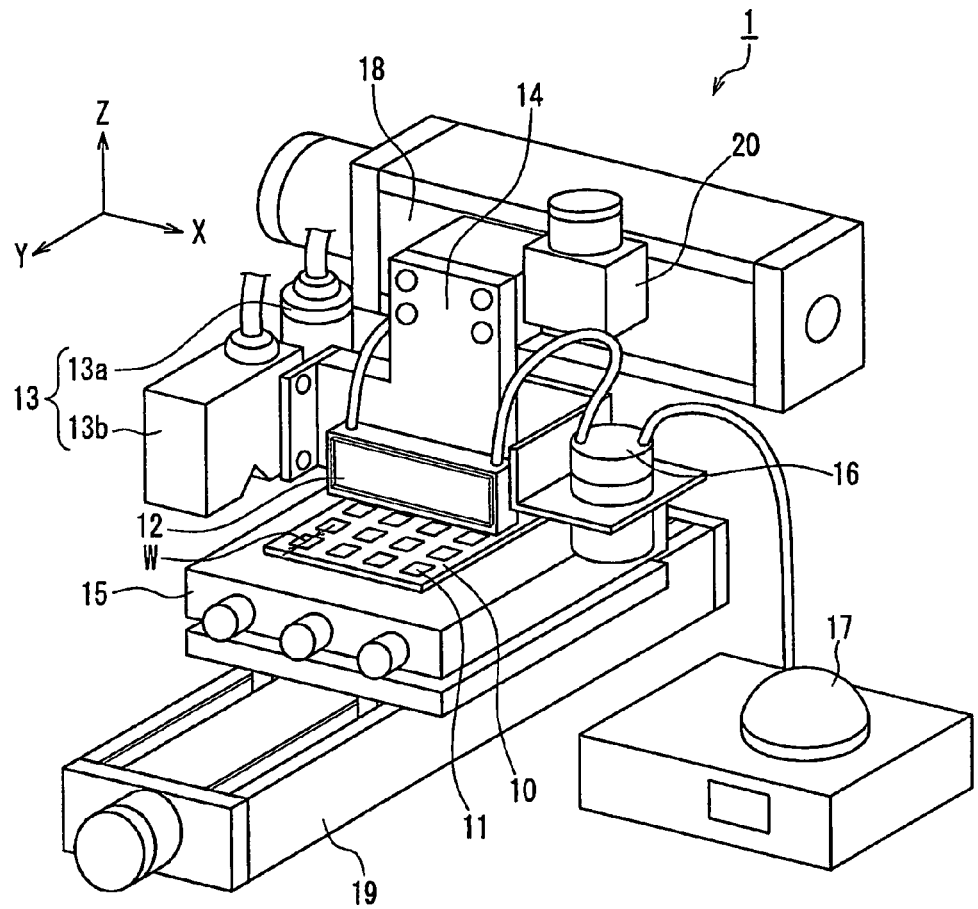
FIG. 1A is a schematic perspective view showing a phosphor layer forming apparatus of Embodiment 1 of the present invention.

The phosphor layer forming apparatus of the present invention is used as an apparatus for forming a phosphor layer by discharging a paste containing a phosphor so as to cover each of a plurality of light-emitting elements mounted on a substrate. The substrate on which the light-emitting elements are mounted is not particularly limited and may be, e.g., a general substrate such as a silicon substrate. The number of light-emitting elements mounted on the substrate also is not particularly limited as long as there are two or more light-emitting elements. The distance between the adjacent light-emitting elements may be, e.g., about 0.03 to 2.5 mm.

A light-emitting element that can emit white light as a result of combination with a phosphor (which will be described later) is suitable for the light-emitting elements. For example, a light-emitting element for emitting blue light such as a GaN LED or ZnS LED may be used. The light-emitting elements generally have a thickness of about 70 to 100 μm and an area of about 0.04 to 9 $mm^2$.

The paste may be obtained by dispersing a phosphor in a fluid resin such as a silicone resin. The viscosity of the paste is generally about 50 to 5000 Pa·s, and preferably about 100 to 2000 Pa·s. When a light-emitting element for emitting blue light is used, the phosphor may be, e.g., a green light emitting phosphor such as $Y_3(Al, Ga)_5O_{12}:Ce^{3+}$ with a garnet structure or silicate $(Ba, Sr)_2SiO_4:Eu^{2+}$, a yellow light emitting phosphor such as SIALON Ca—Al—Si—O—N:$Eu^{2+}$, silicate $(Sr, Ca)_2SiO_4:Eu^{2+}$, or $(Y, Gd)_3Al_5O_{12}:Ce^{3+}$ with a garnet structure, or red light emitting phosphor such as nitridosilicate $Sr_2Si_5N_8:Eu^{2+}$, nitridoaluminosilicate $CaAlSiN_3:Eu^{2+}$, oxo-nitridoaluminosilicate $Sr_2Si_4AlON_7:Eu^{2+}$, or sulfide $CaS:Eu^{2+}$.

The phosphor layer forming apparatus of the present invention includes a discharge portion for discharging the paste in the form of droplets onto each of the light-emitting elements, a measurement portion for measuring the thickness of individual phosphor layers that are formed of the paste covering each of the light-emitting elements, and a discharge control portion for controlling the amount of the paste to be redischarged for each phosphor layer in accordance with the thickness of the individual phosphor layers measured by the measurement portion. The discharge portion of the present invention discharges the paste in the form of droplets, so that the discharge amount can be controlled easily. Moreover, since the apparatus includes the measurement portion and the discharge control portion, if the phosphor layers vary in thickness during formation, the paste is redischarged in accordance with the thickness of the individual phosphor layers. Therefore, it is possible to form the phosphor layers while the variations are corrected. The phosphor layers thus formed can have a uniform thickness without polishing, which in turn reduces the manufacturing time for the light-emitting device. Further, the unnecessary discharge of the paste can be avoided, thereby reducing the manufacturing cost. In this case, the "thickness of individual phosphor layers" means the thickness of a phosphor layer that is located on the principal surface of the light-emitting element.

The discharge portion may include, e.g., a head used for an ink jet printer or a dispenser. In particular, when the discharge portion includes a piezoelectric element, the droplets released therefrom have a smaller diameter, so that the discharge amount of the paste can be controlled easily.

The measurement portion is not particularly limited as long as it can measure the thickness of the individual phosphor layers. For example, the measurement portion may include a recognition camera for recognizing the measurement location and a length measuring device using a laser or the like.

The discharge control portion calculates the amount of the paste to be redischarged for each phosphor layer in accordance with the thickness of the individual phosphor layers measured by the measurement portion so that the phosphor layers can have a uniform thickness, and then allows the discharge portion to redischarge the paste based on the calculated amount. The discharge control portion may include, e.g., a central processing unit (CPU) used in a computer or the like.

The phosphor layer forming apparatus of the present invention further may include a distance control portion for controlling the distance between the discharge portion and the surface of the individual phosphor layers when the paste is redischarged in accordance with the thickness of the individual phosphor layers measured by the measurement portion. With this configuration, the thicknesses of the phosphor layers can be made uniform more easily. For example, when the distance is increased, the paste (droplet) is likely to be spread over the phosphor layer, and a phosphor layer formed of the redischarged paste becomes thin. In contrast, when the distance is decreased, the paste (droplet) is not likely to be spread over the phosphor layer, and a phosphor layer formed of the redischarged paste becomes thick.

In the present invention, the discharge control portion may have the function of controlling the amount of the paste to be redischarged for a predetermined position of the phosphor layer, in addition to the above function. When the phosphor layer is formed by conventional screen printing, the shortest distance from the surface of the phosphor layer to the surface of the light-emitting element generally differs depending on the position of the surface of the phosphor layer. This may pose a problem such as nonuniform luminescent color. In particular, the shortest distance from an edge of the phosphor layer to the surface of the light-emitting element is longer than that from any other position of the surface of the phosphor layer to the surface of the light-emitting element. Therefore, the yellow component of light emitted from the edge of the phosphor layer is increased and responsible for nonuniform luminescent color. As described above, when the discharge control portion also has the function of controlling the amount of the paste to be redischarged for a predetermined position of the phosphor layer, such color nonuniformity can be eliminated. In particular, to control the luminescent color of light emitted from the edge of the phosphor layer that tends to cause color nonuniformity, the predetermined position preferably is the edge of the phosphor layer. The amount of the paste to be redischarged for a predetermined position of the phosphor layer may be controlled in the following manner: the measurement portion measures the height of the predetermined position from the substrate; the discharge control portion calculates the amount of the paste to be redischarged for the predetermined position according to the measured value; and the discharge portion redischarges the paste based on the calculated amount.

In the phosphor layer forming apparatus of the present invention, it is preferable that a value obtained by dividing the diameter of the discharged droplets by the minimum width of the light-emitting element is 0.4 or less. This facilitates control of the discharge of the paste. In particular, when the droplets have a diameter of 1 to 50 μm (i.e., a droplet volume of about 1 femtoliter to 8 picoliter), the discharge amount of the paste can be controlled even more easily.

Next, the phosphor layer forming method of the present invention will be described. When the explanation of the method overlaps with that of the apparatus, it may be omitted in the following.

The phosphor layer forming method of the present invention is a method for forming a phosphor layer by discharging a paste containing a phosphor so as to cover each of a plurality of light-emitting elements mounted on a substrate. The method includes discharging the paste in the form of droplets onto each of the light-emitting elements, measuring the thickness of individual phosphor layers that are formed of the paste covering each of the light-emitting elements, and redischarging the paste onto the phosphor layers in accordance with the thickness of the individual phosphor layers measured in the measuring process while controlling the amount of the paste to be redischarged for each phosphor layer. In the phosphor layer forming method of the present invention, the paste is discharged in the form of droplets, so that the discharge amount can be controlled easily. Moreover, since the method includes the measuring process and the redischarging process, if the phosphor layers vary in thickness during formation, the paste is redischarged in accordance with the thickness of the individual phosphor layers. Therefore, it is possible to form the phosphor layers while the variations are corrected. The phosphor layers thus formed can have a uniform thickness without polishing, which in turn reduces the manufacturing time for the light-emitting device. Further, the unnecessary discharge of the paste can be avoided, thereby reducing the manufacturing cost.

In the redischarging process, the paste may be redischarged while controlling the amount of the paste to be redischarged for a predetermined position of the phosphor layer. This can eliminate nonuniform luminescent color, as described above.

To control the luminescent color of light emitted from the edge of the phosphor layer that tends to cause color nonuniformity, the predetermined portion preferably is the edge of the phosphor layer.

In the phosphor layer forming method of the present invention, it is preferable that a value obtained by dividing the diameter of the discharged droplets by the minimum width of the light-emitting element is 0.4 or less. This facilitates control of the discharge of the paste. In particular, when the droplets have a diameter of 1 to 50 μm (i.e., a droplet volume of about 1 femtoliter to 8 picoliter), the discharge amount of the paste can be controlled even more easily. Hereinafter, embodiments of the present invention will be described in detail.

Embodiment 1

Figure 1B:
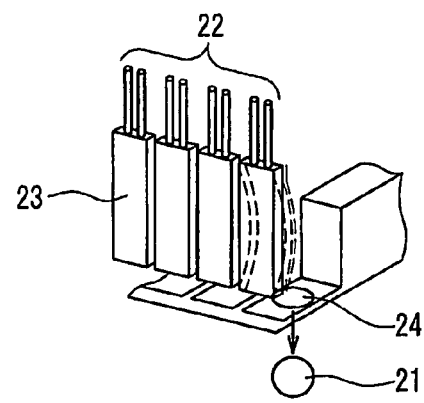
FIG. 1B is a schematic perspective view showing a head included in a discharge portion in FIG. 1A.

A phosphor layer forming apparatus of Embodiment 1 of the present invention will be described with reference to the drawings. FIG. 1A is a schematic perspective view showing the phosphor layer forming apparatus of Embodiment 1. FIG. 1B is a schematic perspective view showing a head included in a discharge portion in FIG. 1A.

As shown in FIG. 1A, the phosphor layer forming apparatus 1 includes the following: a discharge portion 12 for discharging a paste 21 (see FIG. 1B) containing a phosphor in the form of droplets so as to cover each of a plurality of light-emitting elements 11 mounted on a substrate 10; a measurement portion 13 for measuring the thickness of individual phosphor layers 30 (see FIG. 2B) that are formed of the paste 21 covering each of the light-emitting elements 11; a discharge control portion 14 for controlling the amount of the paste 21 to be redischarged for each phosphor layer in accordance with the thickness of the individual phosphor layers 30 measured by the measurement portion 13; a heating stage 15 for carrying the substrate 10; a paste tank 16 for holding the paste 21; a negative pressure pump 17 for developing a negative pressure in the paste tank 16 to prevent leakage of the paste 21 from the discharge portion 12 during an operation other than the discharging process; an X-axis direction controller 18 for controlling the position of the discharge portion 12 in the X-axis direction in FIG. 1A; a Y-axis direction controller 19 for controlling the position of the heating stage 15 in the Y-axis direction in FIG. 1A; and a Z-axis direction controller 20 for controlling the position of the discharge portion 12 in the Z-axis direction in FIG. 1A. The measurement portion 13 includes a recognition camera 13a for recognizing the measurement location and a laser length measuring device 13b. The Z-axis direction controller 20 controls the distance between the discharge portion 12 and the surface of the individual phosphor layers 30 when the paste 21 is redischarged in accordance with the thickness of the individual phosphor layers 30 measured by the measurement portion 13. As the X-axis direction controller 18, the Y-axis direction controller 19, and the Z-axis direction controller 20, e.g., a device that includes a motor, a ball screw attached to the motor, and a motor driver for driving the motor can be used. The Z-axis direction controller 20 corresponds to the "distance control portion".

The discharge portion 12 includes a head 22, as shown in FIG. 1B. The head 22 includes a plurality of piezoelectric elements 23. When the head 22 discharges the paste 21, a piezoelectric element 23 is deformed as indicated by the broken lines in FIG. 1B by allowing a current to flow through the piezoelectric element 23. The deformation of the piezoelectric element 23 generates a differential pressure, so that the paste 21 is discharged from an outlet 24 in the form of droplets. To facilitate control of the discharge of the paste 21, it is preferable that a value obtained by dividing the diameter of the droplets of the paste 21 discharged from the outlet 24 by the minimum width W (see FIG. 1A) of the light-emitting element 11 is 0.4 or less.

With this configuration, since the phosphor layer forming apparatus 1 includes the measurement portion 13 and the discharge control portion 14, if the phosphor layers 30 vary in thickness during formation, the paste 21 is redischarged in accordance with the thickness of the individual phosphor layers 30. Therefore, it is possible to form the phosphor layers 30 while the variations are corrected. The phosphor layers 30 thus formed can have a uniform thickness without polishing, which in turn reduces the manufacturing time for the light-emitting device.

Embodiment 2

A phosphor layer forming method of Embodiment 2 of the present invention will be described with reference to the drawings. FIGS. 2A to 2D are cross-sectional views for explaining the phosphor layer forming method of Embodiment 2. This method may use the phosphor layer forming apparatus 1 of Embodiment 1. In FIGS. 2A to 2D, the same components as those in FIGS. 1A and 1B are denoted by the same reference numerals, and the explanation will not be repeated.

Figure 2A:
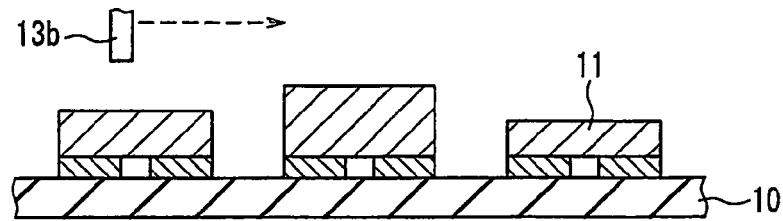
FIGS. 2A to 2D are cross-sectional views for explaining a phosphor layer forming method of Embodiment 2 of the present invention.

As shown in FIG. 2A, the laser length measuring device 13b measures the height of each of the light-emitting elements 11 from the substrate 10. In this case, although not shown in the figure, the recognition camera 13a (see FIG. 1A) may be moved to the measurement location with the X-axis direction controller 18 (see FIG. 1A) and the Y-axis direction controller 19 (see FIG. 1A), and then the laser length measuring device 13b may measure the height.

Figure 2B:
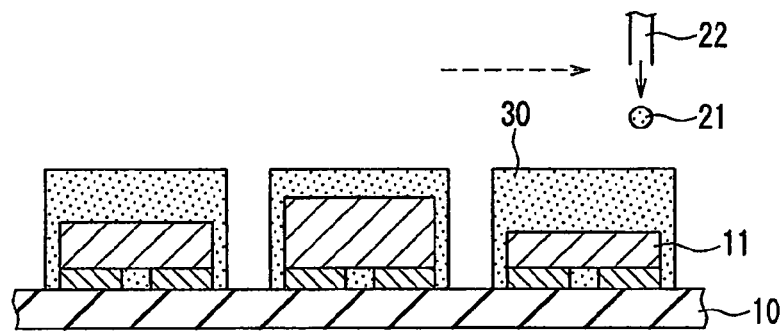

Next, as shown in FIG. 2B, the head 22 discharges the paste 21 in the form of droplets onto each of the light-emitting elements 11. Thus, the phosphor layers 30 can be formed of the paste 21 so as to cover each of the light-emitting elements 11. In this case, to evaporate a solvent included in the paste 21, the temperature of the substrate 10 is maintained preferably in the range of 60° C. to 80° C. by the heating stage 15 (see FIG. 1A).

Figure 2C:
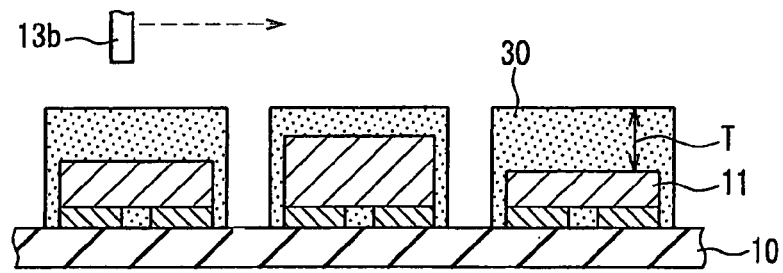

After performing the process of FIG. 2B one or more times, the laser length measuring device 13b measures the height of each of the phosphor layers 30 from the substrate 10, as shown in FIG. 2C. In this case, the measurement portion 13 determines a thickness T (see FIG. 2C) of the phosphor layer 30 from the height of the light-emitting element 11 measured in the process of FIG. 2A and the height of the phosphor layer 30 measured in the process of FIG. 2C. The method for measuring the thickness T of the individual phosphor layers 30 in the present invention is not limited thereto. For example, the thickness T may be measured directly using a laser that pass through only the phosphor layers 30. Alternatively, the thickness T may be determined by any portions (e.g., the discharge control portion 14) other than the measurement portion 13.

Subsequently, the discharge control portion 14 (see FIG. 1A) calculates the amount of the paste 21 to be redischarged for each phosphor layer in accordance with the thickness T of the individual phosphor layers 30 measured by the measurement portion 13. Based on the calculated amount, the head 22 redischarges the paste 21, as shown in FIG. 2D.

Figure 2D:
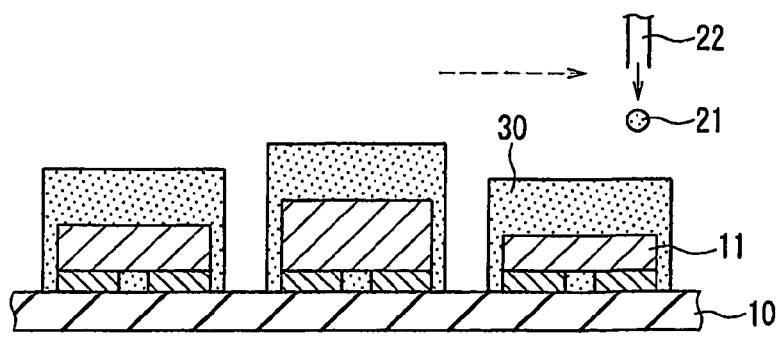

The phosphor layers 30 with a uniform thickness can be obtained by performing the processes of FIGS. 2C to 2D one or more times. Unlike the conventional method, the phosphor layers 30 formed by this method can have a uniform thickness without polishing, which in turn reduces the manufacturing time for the light-emitting device. In the process of FIG. 2D, the thicknesses of the phosphor layers 30 can be made uniform more easily by controlling the discharge pressure of the paste 21 when it is redischarged from the head 22 or by controlling the distance between the discharge portion 12 and the surface of the individual phosphor layers 30 in accordance with the thickness of the individual phosphor layers 30 with the Z-axis direction controller 20 (see FIG. 1A).

Embodiment 3

Figure 3A:
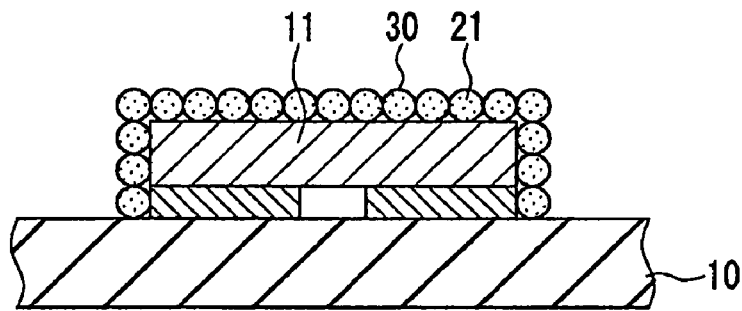
FIGS. 3A to 3C are cross-sectional views for explaining a phosphor layer forming method of Embodiment 3 of the present invention.
Figure 3B:
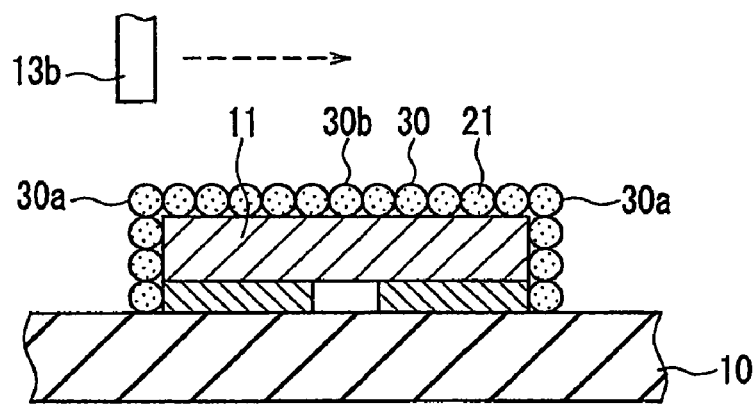
Figure 3C:
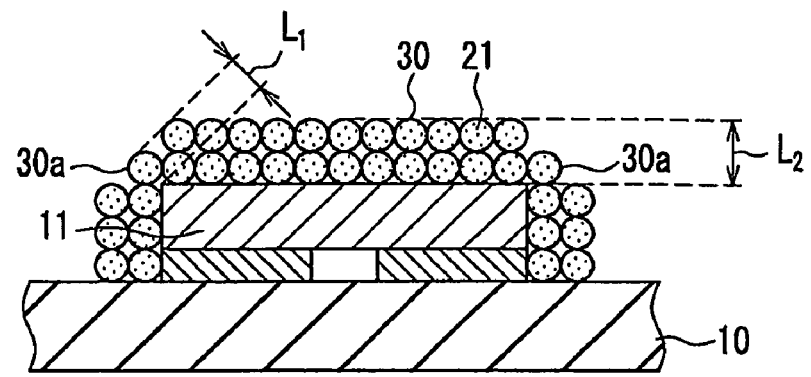
Figure 4A:
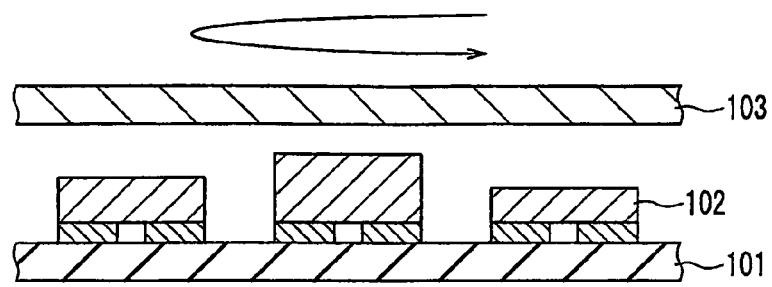
FIGS. 4A to 4D are cross-sectional views showing conventional manufacturing processes for a light-emitting device.
Figure 4B:
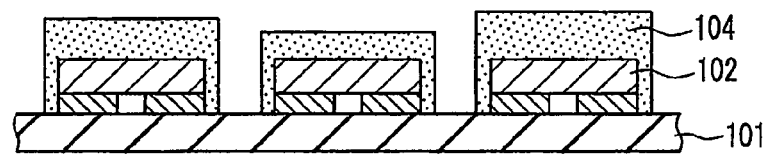
Figure 4C:
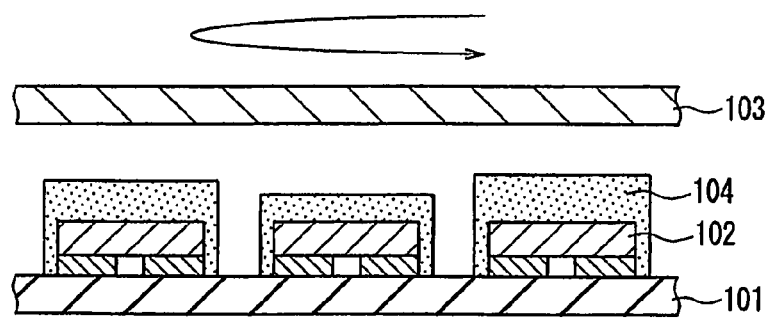
Figure 4D:
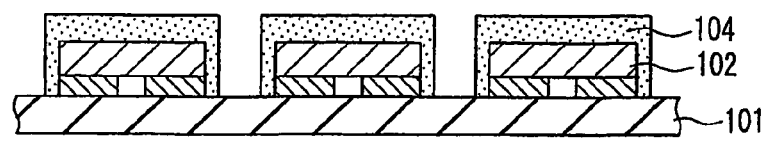
Figure 5A:
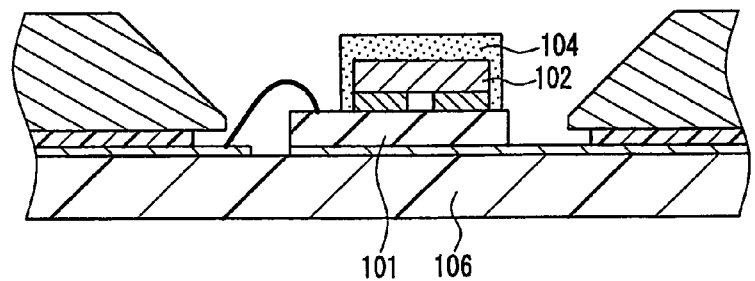
FIGS. 5A to 5C are cross-sectional views showing conventional manufacturing processes for a light-emitting device.
Figure 5B:
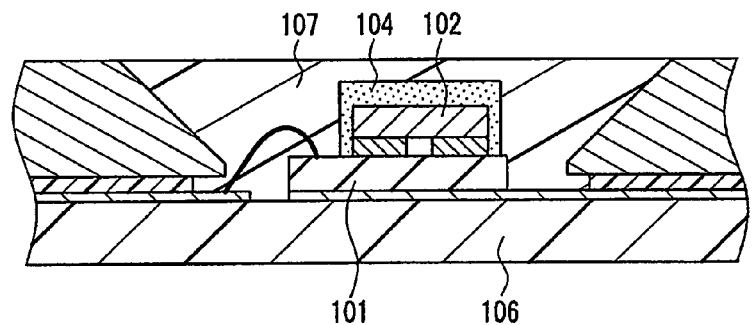
Figure 5C:
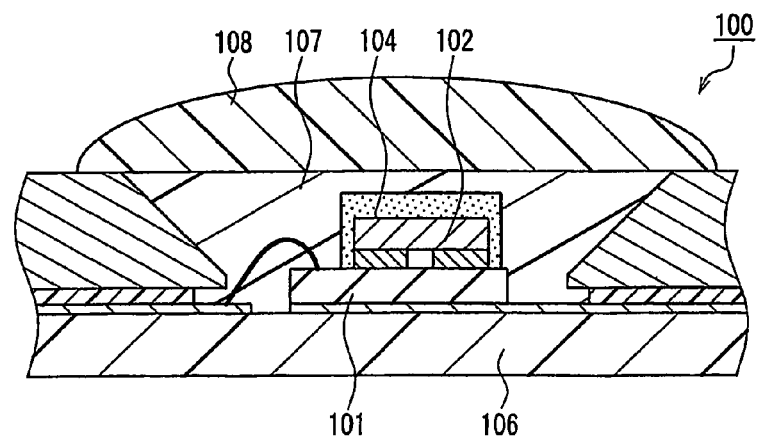

A phosphor layer forming method of Embodiment 3 of the present invention will be described with reference to the drawings. FIGS. 3A to 3C are cross-sectional views for explaining the phosphor layer forming method of Embodiment 3. In this method, the variations in thickness of the phosphor layers 30 are controlled in the same manner as the phosphor layer forming method of Embodiment 2. Therefore, only the features different from the method of Embodiment 2 will be described below. In FIGS. 3A to 3C, the same components as those in FIGS. 2A to 2D are denoted by the same reference numerals, and the explanation will not be repeated.

As shown in FIG. 3A, the paste 21 is discharged in the form of droplets onto a light-emitting element 11 to form a phosphor layer 30.

Next, as shown in FIG. 3B, the laser length measuring device 13b measures the height of the phosphor layer 30 from the substrate 10. In this case, the height from the substrate 10 is measured at two or more locations of the surface of the phosphor layer 30. For example, the heights of the phosphor layer 30 at the edge 30a and in the central portion 30b of the principal surface may be measured.

Subsequently, the discharge control portion 14 (see FIG. 1A) calculates the amount of the paste to be redischarged for a predetermined position of the phosphor layer 30 in accordance with the measured value. Based on the calculated amount, the paste 21 is redischarged onto the phosphor layer 30, as shown in FIG. 3C. In this case, e.g., the upper limit of the height at the edge 30a of the phosphor layer 30 may be input to the discharge control portion 14 beforehand, and the amount of the paste 21 to be redischarged for the edge 30a of the phosphor layer 30 may be controlled so as not to exceed the upper limit by the discharge control portion 14. Accordingly, as shown in FIG. 3C, the shortest distance $L_1$ from the edge 30a of the phosphor layer 30 to the surface of the light-emitting element 11 can be substantially the same as the shortest distance $L_2$ from any other position of the surface of the phosphor layer 30 to the surface of the light-emitting element 11, thus eliminating nonuniform luminescent color.

INDUSTRIAL APPLICABILITY

The phosphor layer forming apparatus and method of the present invention are useful for a manufacturing method of a light-emitting device that is required to reduce the manufacturing time.

The invention claimed is:

1. An apparatus for forming a phosphor layer in which a paste containing a phosphor is discharged so as to cover each of a plurality of light-emitting elements mounted on a substrate, comprising:
    a discharge portion for discharging the paste in the form of droplets onto each of the light-emitting elements;
    a measurement portion for measuring a thickness of individual phosphor layers that are formed of the paste covering each of the light-emitting elements; and
    a discharge control portion for controlling an amount of the paste to be redischarged for each phosphor layer in accordance with the thickness of the individual phosphor layers measured by the measurement portion,
    wherein the discharge of the paste is controlled so that a value obtained by dividing a diameter of the discharged droplets by a minimum width of the light-emitting element is 0.4 or less.

2. The apparatus according to claim 1, further comprising a distance control portion for controlling a distance between the discharge portion and a surface of the individual phosphor layers when the paste is redischarged in accordance with the thickness of the individual phosphor layers measured by the measurement portion.

3. The apparatus according to claim 1, wherein the discharge control portion controls the amount of the paste to be redischarged for a predetermined position of the phosphor layer.

4. The apparatus according to claim 3, wherein the predetermined position is an edge of the phosphor layer.

* * * * *